United States Patent
Harvey

(10) Patent No.: US 12,222,402 B2
(45) Date of Patent: Feb. 11, 2025

(54) APPARATUS AND METHOD FOR MEASURING BATTERY CELL VOLTAGE

(71) Applicant: Renesas Electronics America Inc., Milpitas, CA (US)

(72) Inventor: Thomas Patrick Harvey, Novi, MI (US)

(73) Assignee: Renesas Electronics America Inc., Milpitas, CA (US)

( * ) Notice: Subject to any disclaimer, the term of this patent is extended or adjusted under 35 U.S.C. 154(b) by 187 days.

(21) Appl. No.: 17/742,505

(22) Filed: May 12, 2022

(65) Prior Publication Data
US 2023/0366947 A1 Nov. 16, 2023

(51) Int. Cl.
*G01R 31/396* (2019.01)
*G01R 31/3835* (2019.01)
*H02J 7/00* (2006.01)

(52) U.S. Cl.
CPC ....... *G01R 31/396* (2019.01); *G01R 31/3835* (2019.01); *H02J 7/00032* (2020.01); *H02J 7/0047* (2013.01)

(58) Field of Classification Search
CPC ............... G01R 31/396; G01R 31/3835; H02J 7/00032; H02J 7/0047
See application file for complete search history.

(56) References Cited

U.S. PATENT DOCUMENTS

| | | | |
|---|---|---|---|
| 2011/0050236 A1* | 3/2011 | Sekizaki | G01R 31/396 324/426 |
| 2021/0156927 A1* | 5/2021 | Hatani | H01M 10/48 |

OTHER PUBLICATIONS

TLE9012DQU Li-ion battery monitoring and balancing IC, Infineon, Jan. 24, 2022 (Year: 2022).*
Basics of UART Communication, available at https://www.circuitbasics.com/basics-uart-communication/ on Mar. 25, 2022 (Year: 2022).*
How to Add Binary Numbers, available at https://www.wikihow.com/Add-Binary-Numbers on Nov. 28, 2021 (Year: 2021).*
A. Shi-qi, Q. An-ning and Z. Yu-wei, "Design and realization of SPI interface in lithiumion battery voltage measuring system," 2011 6th International Conference on Computer Science & Education (ICCSE), Singapore, 2011, pp. 83-87 (Year: 2011).*

* cited by examiner

*Primary Examiner* — Daniel R Miller
(74) *Attorney, Agent, or Firm* — SCULLY, SCOTT, MURPHY & PRESSER, P.C.

(57) ABSTRACT

In an embodiment, an apparatus is disclosed that includes a first battery management circuit. The first battery management circuit is configured to measure a voltage of a first battery cell of a battery pack and to generate a first voltage measurement based at least in part on the measured voltage of the first battery cell. The first battery management circuit is configured to receive a bit of a first response from a second battery management circuit. The bit of the first response is generated by the second battery management circuit based at least in part on a measured voltage of a second battery cell of the battery pack. The first battery management circuit is configured to sum the bit of the first response with a corresponding bit of the first voltage measurement and to provide the summed bit to a third battery management circuit as part of a second response.

17 Claims, 7 Drawing Sheets

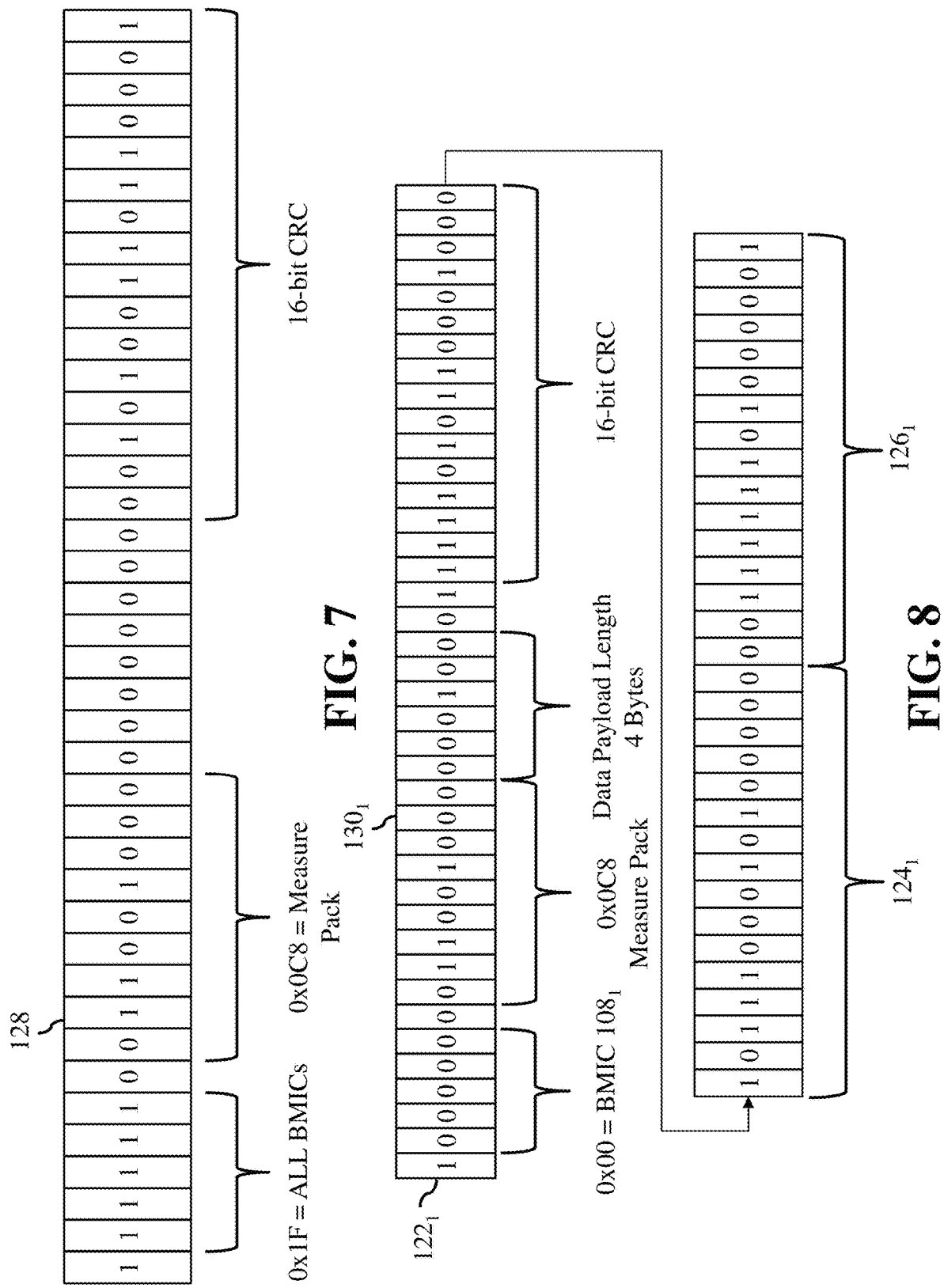

APPARATUS AND METHOD FOR MEASURING BATTERY CELL VOLTAGE

BACKGROUND OF THE SPECIFICATION

The present disclosure relates in general to apparatuses and methods for measuring properties of devices and, in some embodiments, to apparatuses and methods for measuring battery cell voltages in battery packs.

Electrified vehicles typically comprise a powertrain having at least one electric motor, a motor controller, an electric energy storage battery and an electronic control unit for monitoring the battery and controlling the charge and discharge of the battery. The electronic control unit is sometimes referred to as a Battery Management System (BMS). The BMS often relies on a daisy chain architecture to communicate commands and receive responses from measurement devices regarding the status of the electric energy storage battery. Often the throughput of such a daisy chain architecture is limited by the bandwidth of the daisy chain architecture and the latency between the time it takes to send commands to each measurement device and to receive responses back from each measurement device via the daisy chain architecture. In some cases, the throughput and latency of the daisy chain architecture may impact the usefulness of the measurement data received from the measurement devices.

SUMMARY

In an embodiment, an apparatus is disclosed that comprises a first battery management circuit. The first battery management circuit is configured to measure a voltage of a first battery cell of a battery pack and to generate a first voltage measurement based at least in part on the measured voltage of the first battery cell. The first battery management circuit is configured to receive a bit of a first response from a second battery management circuit. The bit of the first response is generated by the second battery management circuit based at least in part on a measured voltage of a second battery cell of the battery pack. The first battery management circuit is configured to sum the bit of the first response with a corresponding bit of the first voltage measurement and to provide the summed bit to a third battery management circuit as part of a second response.

In another embodiment, a system is disclosed that comprises a plurality of circuits connected in a daisy chain. Each given circuit of the plurality of circuits is configured to measure a property of a device of a plurality of devices that corresponds to the given circuit, to generate a measurement value corresponding to the given circuit based at least in part on the measurement of the property of the device corresponding to the given circuit and to receive a bit from a preceding circuit in the daisy chain. The bit from the preceding circuit is generated by the preceding circuit based at least in part on a measurement value generated by the preceding circuit. Each given circuit of the plurality of circuits is configured to sum the received bit with a corresponding bit of the measurement value corresponding to the given circuit and to provide the summed bit to a subsequent circuit in the daisy chain.

In another embodiment, a method performed by a circuit comprising hardware is disclosed. The method comprises measuring a voltage of a first battery cell of a battery pack, generating a first voltage measurement based at least in part on the measured voltage of the first battery cell and receiving a bit of a first response from a second battery management circuit. The bit of the first response is generated by the second battery management circuit based at least in part on a measured voltage of a second battery cell of the battery pack. The method further comprises summing the bit of the first response with a corresponding bit of the first voltage measurement and providing the summed bit to a third battery management circuit as part of a second response.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 7 is a diagram illustrating an example command that may be utilized by the battery management system of FIG. 1 according to an embodiment.

FIG. 8 is a diagram illustrating an example response that may be utilized by the battery management system of FIG. 1 according to an embodiment.

DETAILED DESCRIPTION

Electrified vehicles typically comprise a powertrain having at least one electric motor, a motor controller, an electric energy storage battery and an electronic control unit for monitoring the battery and controlling the charge and discharge of the battery. The electronic control unit is sometimes referred to as a Battery Management System (BMS). There are many vehicle architectures that include electrification features, including, for example, Hybrid Electric Vehicles (HEV), Battery Electric Vehicles (BEV), Plug-in Hybrid Electric Vehicles (PHEV), or other types of electrified vehicles. Such electrified vehicles may be collectively referred to as xEVs.

Figure 1:
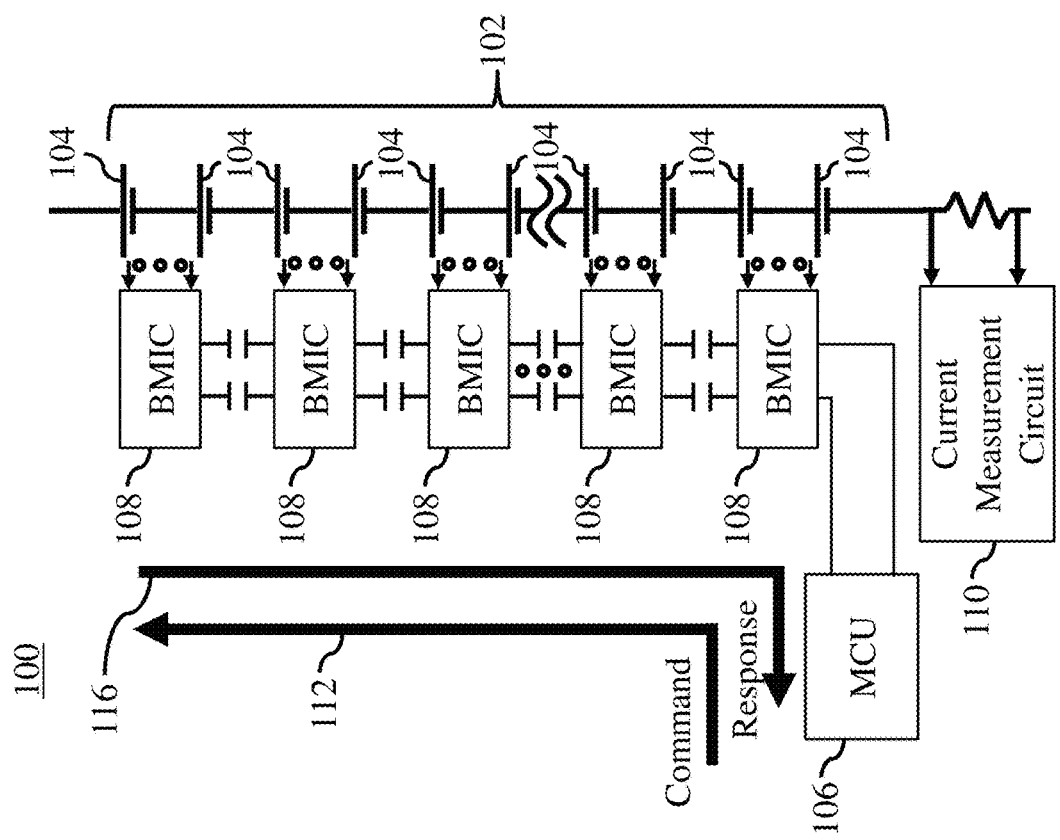
FIG. 1 is a circuit diagram of an example battery management system according to an embodiment.
Figure 2:
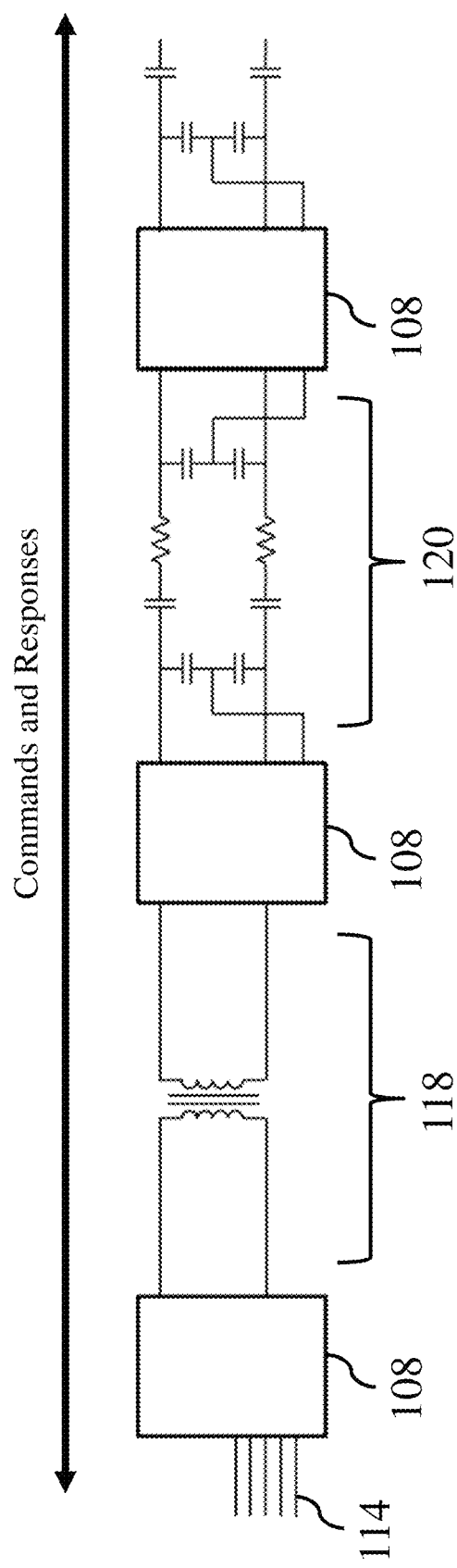
FIG. 2 is a circuit diagram illustrating example isolation techniques that may be utilized by the battery management system of FIG. 1 according to an embodiment.

With reference to FIGS. 1 and 2, an example BMS 100 according to illustrative embodiments will be described.

The electric energy storage battery comprises one or more battery packs 102 each comprising a plurality of individual battery cells 104, for example, between one hundred and two hundred battery cells 104, that are connected together in series. In current vehicles, each battery cell 104 is typically rated for around 4 volts (V) with peak total voltage of the battery pack 102 being between 400V and 800V. BMS 100 is configured to measure the voltage of each battery cell 104 in battery pack 102. Other numbers of battery cells 104 and voltage ratings may alternatively be utilized.

A typical BMS has stringent accuracy requirements, e.g., is able to measure the voltage of a battery cell to within +/−2 mV over all possible conditions, is configured to operate in a high-voltage environment and is configured to efficiently communicate measurement information to a microcontroller unit (MCU) in the BMS which typically operates at a lower voltage such as that used for other vehicle loads such as, e.g., the radio, wipers, fans, etc. As an example, BMS 100 may comprise an MCU 106 such as, e.g., a processor, central processing unit (CPU), field-programmable gate array (FPGA), application-specific integrated circuit (ASIC) or any other circuitry. In addition, BMS 100 is configured to measure a common battery current delivered by battery pack 102, or returned to battery pack 102 during charging, and to measure the temperatures of battery cells 104.

BMS 100 measures the voltages of the individual battery cells 104, for example, using measurement circuits, also referred collectively and individually as Battery Management Integrated Circuits (BMICs) 108. As an example, each BMIC 108 may be configured to measure the voltages of a subset of battery cells 104, e.g., eight battery cells, fourteen battery cells, sixteen battery cells or another number of battery cells. For example, in some embodiments, a BMIC 108 may comprise an input for each battery cell 104 being measured by that BMIC 108. BMICs 108 may comprise, e.g., a processor, central processing unit (CPU), field-programmable gate array (FPGA), application-specific integrated circuit (ASIC) or any other circuitry that is configured to measure voltages of one or more battery cells 104 and to communicate with other BMICs 108 or with MCU 106. BMS 100 may also measure the current of the entire battery pack 102, also referred to as the common battery pack current using a current measurement circuit 110 such as, e.g., a resistive current sense shunt or other circuitry.

In order to measure the voltage of the entire battery pack 102, multiple BMICs 108 may be required. For example, in a two hundred battery cell of battery pack 102, twelve BMICs 108 that are configured to measure sixteen battery cells each and one BMIC 108 that is configured to measure eight battery cells may be utilized. Any other arrangement or configuration of BMICs 108 may alternatively be utilized to measure battery cells 104 of battery pack 102.

In some embodiments, in order for a single MCU 106 to issue commands for the measurements of battery cells 104 and to read back the resulting data, all of the BMICs 108 are connected together, e.g., with a two-wire network. In addition, since the battery cells 104 that are being measured are connected in series, the corresponding BMICs 108 often communicate in series as well using an interface that is architected as a daisy chain, for example, as shown in FIG. 1. For example, a command 112 for a particular BMIC 108 may be transmitted from MCU 106 via a serial peripheral interface (SPI) 114 (FIG. 2) to the first BMIC 108, and then passed along via the daisy chain to each successive BMIC 108 until it reaches the end of the chain. Similarly, a response 116 that originates from the queried BMIC 108 is sent back down the chain to MCU 106. In illustrative embodiments, commands 112 and responses 116 are transmitted and received bit-by-bit along the daisy chain, e.g., to send a command 112 up the daisy chain, each BMIC 108 passes along one bit of the command at a time, creating a cascading transfer of bits. For example, to transmit command 112 along the daisy chain, command 112 is provided to the first BMIC 108 by MCU 106 via SPI 114 and stored on the first BMIC 108. In some embodiments, command 112 may alternatively be stored at an intermediary translator integrated circuit or other data buffer before being provided to the first BMIC 108. Next, a first bit of command 112 is provided to the second BMIC 108 by the first BMIC 108 at a first time, a second bit of command 112 is provided to the second BMIC 108 by the first BMIC 108 at a second time and so on. The process continues until all bits of command 112 have been successfully passed along the entire daisy chain bit-by-bit from the first BMIC 108 to the last BMIC 108. In other embodiments, BMICs 108 may be configured to transfer multiple bits at each time to the next BMIC 108 on the daisy chain.

Figure 3:
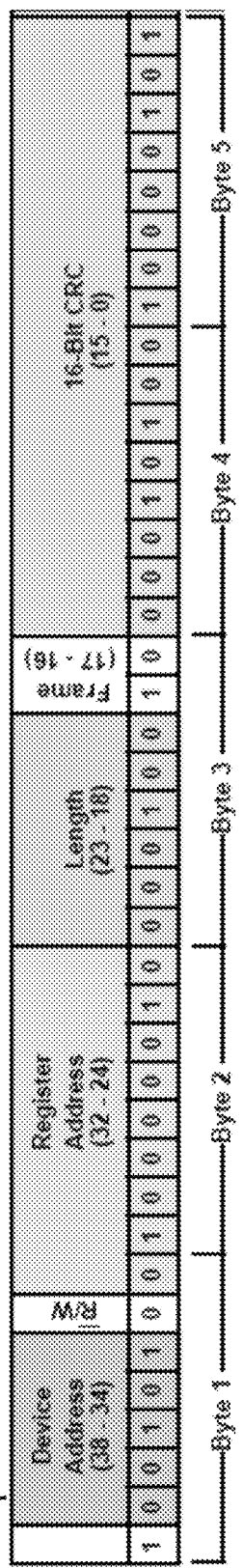
FIGS. 3-5 are diagrams illustrating example communication protocols that may be utilized by the battery management system of FIG. 1 according to an embodiment.
Figure 4:
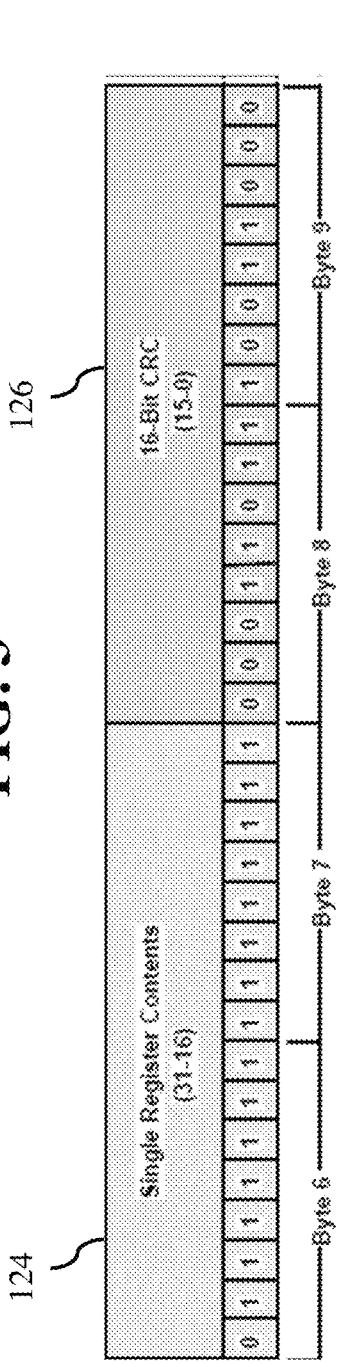
Figure 5:
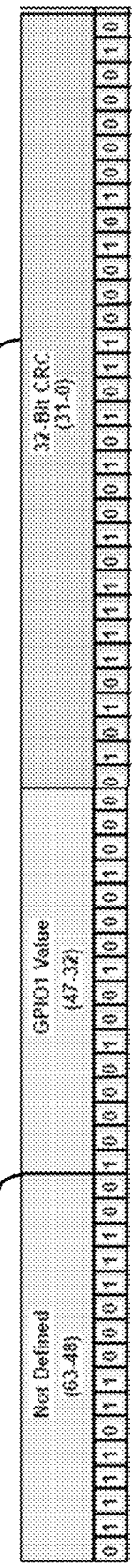

With reference to FIGS. 3-5, an example communication protocol for communication between MCU 106 and BMICs 108 will be described. The communication protocol is based on a half-duplex command and response architecture. Each command or response that is sent to, transferred between or received from the BMICs 108 starts with a 5-byte header 122, for example, as shown in FIG. 3. For example, header 122 may comprise an indication of a device address, a read/write indicator, a register address, an indication of a length, a frame and cyclic redundancy check (CRC). Header 122 may also or alternatively comprise other elements. If data is also to be sent or received, a data packet 124 and corresponding CRC 126 follows header 122, for example, as shown in FIGS. 4 and 5. FIG. 4 shows an example of a 16-bit data packet 124 with a 16-bit CRC 126. FIG. 5 shows an example of a 32-bit data packet 124 having a 32-bit CRC 126 in the case that the data packet being sent is more than two bytes. Any other size of data packet 124 and CRC 126 may alternatively be utilized.

Because battery cells 104 are connected in series, the electrical potential of each of battery cells 104, as sensed by the corresponding BMIC 108, is based on how high the battery cell 104 is in the series. In order to survive such large differences in electrical potential, each BMIC 108 may have communication ports that are electrically isolated by either a transformer isolation method 118 or a capacitive isolation method 120 such as those shown in FIG. 2. In illustrative embodiments, BMICs 108 support either type of isolation method, and both isolation methods 118 and 120 can be used interchangeably within the daisy chain of BMICs 108. Other isolation methods may also or alternatively be utilized.

BMS 100, through the use of BMICs 108, is configured to measure the total battery pack voltage of battery pack 102. The total battery pack voltage is the measured voltage from one end of battery pack 102 to the other end and is equivalent to the sum of the voltages of all of the individual battery cells 104. An accurate measure of the total battery pack voltage may be utilized to optimize the performance of the xEV or other application and it may therefore be desirable to measure the total battery pack voltage of the battery pack 102 as frequently as possible.

In an example embodiment, the total battery pack voltage may be utilized along with a measurement of the battery pack current taken in the same timeframe to calculate an instantaneous battery pack power for that timeframe. The instantaneous battery pack power may then be utilized to optimize the performance of the xEV or other application. The total battery pack voltage may also or alternatively be utilized in any other manner.

In a typical BMS, the measurement of the voltage of each battery cell 104 or group of battery cells 104 requires a separate command and response to be sent to each BMIC 108 which may result in a data collection rate for gathering the measured voltages of the battery cells 104 that is much slower than a desired rate for the measurement of the total battery pack voltage, e.g., since the command and response for each BMIC 108 or each battery cell 104 needs to be separately transferred through the daisy chain on a bit-by-bit basis.

In some cases, a separate circuit may be used to measure the total battery pack voltage. For example, the circuit may span the battery pack and read the voltage of the entire battery pack. However, such a circuit may have its own challenges. For example, since the total battery pack voltage may be 400V, 800V or higher, such a measurement circuit may need to utilize components that can withstand these large voltages such as, e.g., resistors, etc., which may be both expensive and inefficient. In addition, since analog to digital converters typically only accept input voltages that are much smaller than the voltage of the battery pack, the total battery pack voltage would need to be scaled down to a smaller voltage before being measured. Such a down scaling, however, comes at a cost as the tolerances of high voltage rated resistors may affect the accuracy of the final measurement.

In addition, the use of a total battery pack voltage measurement circuit may result in a load on the battery pack that continues to drain the battery pack even when the xEV is turned off. Such a drain may be overcome by including a switch to disconnect the total battery pack measurement circuit, but such a switch and its supporting components will also need to be rated for the high voltages of the battery pack which may add additional costs and possibly affect the accuracy of the measurement. Since the total pack voltage is also a measurement in the high voltage domain, an isolation scheme will need to be used to communicate the measured voltage data back the MCU which is operating in the low voltage domain.

In some embodiments, a single command may alternatively be sent to all of the BMICs 108 via the daisy chain that instructs each BMIC 108 to measure the voltages of each of their corresponding battery cells 104 at the same moment, with each BMIC 108 separately transferring the results of the measurement along the daisy chain back to MCU 106. MCU 106 then adds up the individual voltages to determine the total battery pack voltage. While a single command may reduce some of the delay, latency within the daisy chain communications from BMIC 108 to BMIC 108, as well as differences in measurement timing within each BMIC 108 may result in a time difference between the voltage measurements. In some cases, these issues may be partly overcome by utilizing BMICs 108 that are configured to be able to perform the voltage measurements at the same time regardless of the communication latency.

However, communication latency for returning the result to MCU 106 may still be a challenge. For example, communications bandwidth may be a limiting factor in the response time of a voltage measurement and therefore in the frequency of calculating the instantaneous battery pack power for optimizing the performance of the xEV or other application. For example, since the daisy chain interface has a fixed bandwidth, e.g., bit-by-bit, the time it takes for MCU 106 to send a command requesting voltage measurements to and receive a response back from each BMIC 108 may on its own take significantly longer than a useful frequency of calculating the instantaneous battery pack power for optimizing the performance of the xEV or other application.

In some embodiments, BMICs 108 may comprise a separate input pin that is configured to measure the total voltage of the battery cells 104 connected to that BMIC 108. This function allows BMICs 108 to measure the module voltage, e.g., the combined voltage of each of their corresponding battery cells 104, with a single measurement. Each BMIC 108 may then be configured to return a single measurement for all of its battery cells 104, e.g., instead of sixteen individual battery cell measurements in the case of a BMIC 108 that is configured to measure sixteen battery cells individually.

However, the communications timing to provide the single measurement for each BMIC 108 down the daisy chain may still include substantial overhead. For example, MCU 106 may send a command to all BMICs 108 instructing them to measure their module voltage. Then, one-by-one, MCU 106 requests each BMIC 108 to report back its voltage measurement. In addition, each message sent on the daisy chain may include many extra pieces of data such as, e.g., command bytes, address bytes, packet length bytes, CRCs, etc. Because each BMIC 108 needs to be separately queried and have its measurement data separately returned to MCU 106 for summation by MCU 106, the frequency of calculating the corresponding instantaneous battery pack power may still be too slow for practical use in optimizing the performance of the xEV or other application.

Figure 6:
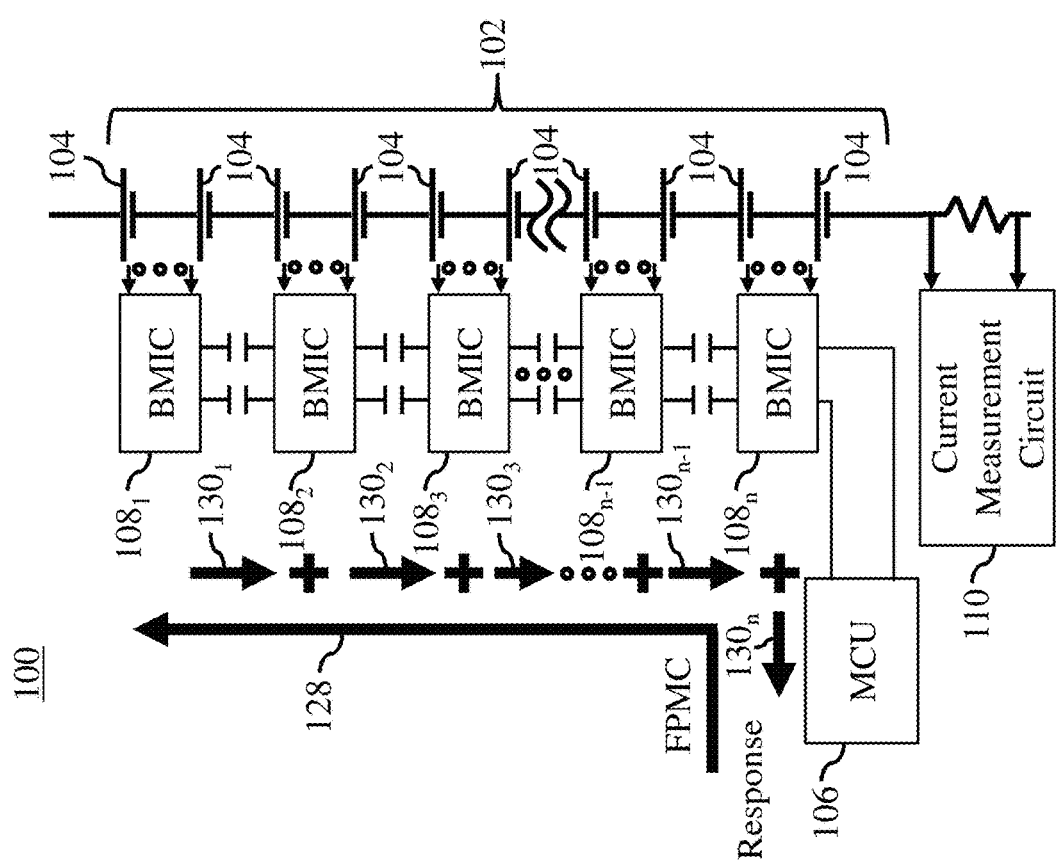
FIG. 6 is a circuit diagram illustrating an example communication process that may be utilized by the battery management system of FIG. 1 according to an embodiment.

With reference to FIGS. 6-8, in an illustrative embodiment, BMS 100 is configured to implement a command and response strategy that is configured to quickly return an accurate measurement of the total battery pack voltage using a minimal amount of communication bandwidth and reduced communication latency. In this embodiment, MCU 106 is configured to issue a single fast pack measurement command (FPMC) 128 to the daisy chain of BMICs 108, e.g., BMICs $108_1$, $108_2$, $108_3$, ... $108_{n-1}$, $108_n$, that applies to all BMICs 108 at the same time. An example FPMC 128 is illustrated in FIG. 7 and includes a device address of 0x1F that indicates all BMICs 108, register address of 0x0C8 that indicates a measure pack command and a corresponding 16-bit CRC. In other embodiments, different values may alternatively be utilized to indicate all BMICs 108 and the measure pack command.

As FPMC 128 travels along the daisy chain, e.g., bit-by-bit, each BMIC 108 recognizes FPMC 128 and samples the respective module voltage of the corresponding set of battery cells 104 simultaneously. For example, in some embodiments, FPMC 128 may designate a predetermined time at which the sampling for all BMICs 108 should occur. In some embodiments, each BMIC 108 may know its position and relative latency on the daisy chain and be configured to determine the predetermined time based on when it receives FPMC 128. In some embodiments, the predetermined time is based on how long it takes for FPMC 128 to reach BMIC $108_1$ at the top of the chain.

After the sampling time is complete, responses 130 to FPMC 128, e.g., responses $130_1$, $130_2$, $130_3$, ... $130_{n-1}$ and $130_n$, are transmitted along the daisy chain. Each response 130 includes a header 122, a data packet 124 and a CRC 126 (FIGS. 3-5). An example response $130_1$ issued by BMIC $108_1$ is illustrated in FIG. 8. Response $130_1$ comprises header $122_1$ including a device address of 0x00 corresponding to BMIC $108_1$, a register address of 0x0C8 that indicates a response to the measure pack command, a data payload length and a corresponding 16-bit CRC. Response $130_1$ also comprises data packet $124_1$ comprising the module voltage measurement for BMIC $108_1$ and a corresponding CRC $126_1$. In an illustrative embodiment, the module voltage measurement is transmitted least significant bit first in data packet $124_1$. In an illustrative embodiment, the 11 most significant bits of the module voltage measurement for BMIC $108_1$ are transmitted in data packet $124_1$ and any remaining bits of data packet $124_1$ are cleared, e.g., set to 0.

In other embodiments, the module voltage measurement may comprise any other number of bits in any other format.

Response $130_1$ begins at BMIC $108_1$ in the daisy chain and is transmitted to BMIC $108_2$ bit-by-bit. As part of the data packet $124_1$ of response $130_1$, the module voltage measurement taken by BMIC $108_1$ is transmitted to BMIC $108_2$.

Figure 9:
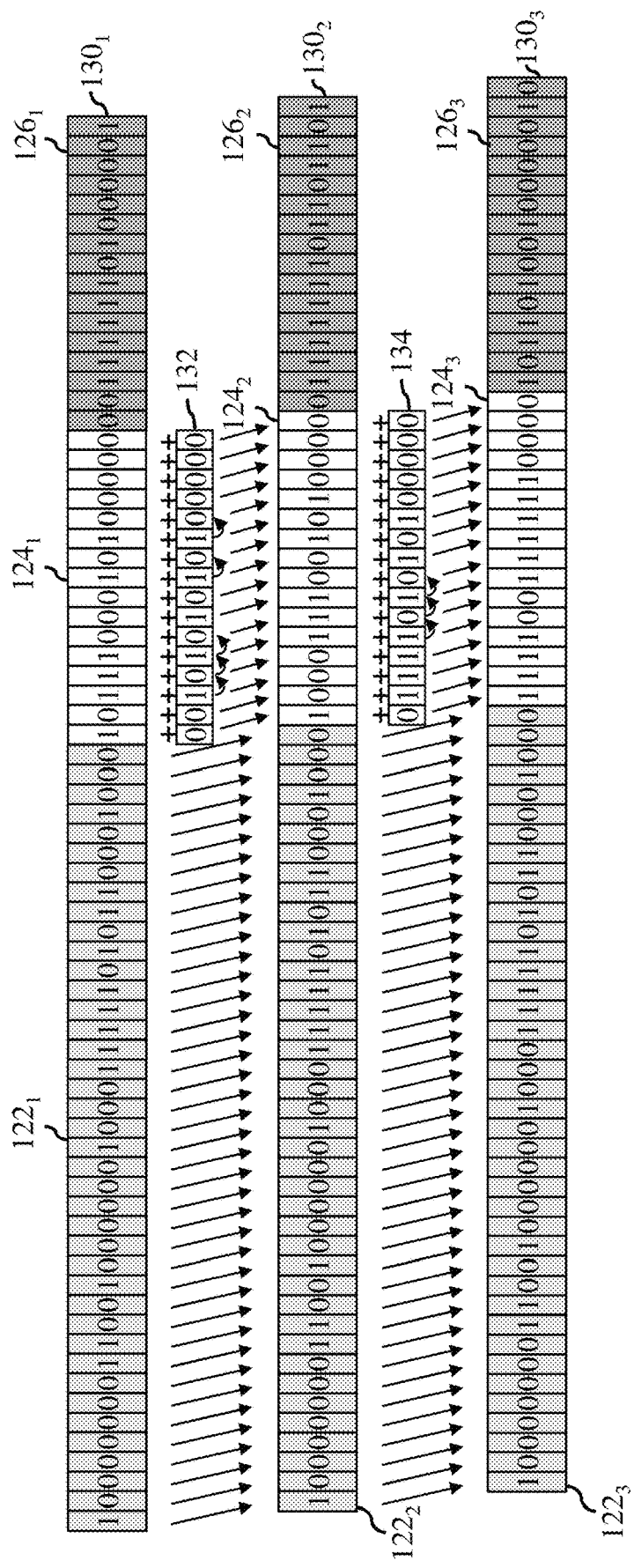
FIG. 9 is a diagram illustrating an example response according to the communication process of FIG. 6 according to an embodiment.

Each successive BMIC 108 in the daisy chain is configured to delay the transmission of its own response 130 by one bit time relative to the BMIC 108 that precedes it in the daisy chain. For example, as shown in FIGS. 6 and 9, BMIC $108_2$ will receive the first bit of response $130_1$ from BMIC $108_1$ and will transmit the first bit of its own response $130_2$ at the same time that it receives the second bit of response $130_1$ from BMIC $108_1$. The transmission of the response 130 of each successive BMIC 108 in the daisy chain is delayed by an additional bit time relative to response $130_1$ of BMIC $108_1$. In an illustrative embodiment, each successive response includes the same information in header 122. For example, the device address for each header 122 corresponds to the address of the BMIC 108 at the top of the daisy chain, e.g., 0x00 for BMIC $108_1$. As shown in FIG. 9, for example, header $122_1$, header $122_2$ and header $122_3$ are the same and all have a device address of 0x00. In other embodiments, the device address for each header 122 may correspond to the BMIC 108 providing the response down the daisy chain, e.g., 0x00 for BMIC $108_1$, 0x01 for BMIC $108_2$, 0x02 for BMIC $108_3$ and so on to BMIC $108_n$ at the end of the daisy chain.

With reference again to FIGS. 6 and 9, each successive BMIC 108 receives a summed module voltage measurement of all of the BMICs 108 above it in the daisy chain and adds its own module voltage measurement to the sum, bit-by-bit, as the bits are transferred down the daisy chain. The bits of the summed module voltage measurement are transmitted down to the next BMIC 108 in the daisy chain as part of the next response 130. In this manner, the summation of the module voltage measurements occurs at each BMIC 108 as the module voltage measurements travel down the daisy chain such that when the final response $130_n$ is provided by BMIC $108_n$ to MCU 106, the final response $130_n$ comprises a data packet 124 with the summed module voltage measurements of all of BMICs 108 in the daisy chain, i.e., the total pack voltage measurement.

For example, as shown in FIG. 9, BMIC $108_1$ transmits response $130_1$ to BMIC $108_2$ that comprises a header $122_1$, a data packet $124_1$ and a corresponding CRC $126_1$. Data packet $124_1$ comprises the module voltage measurement of BMIC $108_1$. As mentioned above, the responses 130 are transmitted bit-by-bit in an illustrative embodiment starting with the header and each successive response 130 is offset by one bit time. For example, a response $130_2$ comprising a header $122_2$, a data packet $124_2$ and a corresponding CRC $126_2$ is transmitted bit-by-bit by BMIC $108_2$ to BMIC $108_3$ one bit time later than the transmission of response $130_1$ by BMIC $108_1$ to BMIC $108_2$. Similarly, a response $130_3$ comprising a header $122_3$, a data packet $124_3$ and a corresponding CRC $126_3$ is transmitted bit-by-bit by BMIC $108_3$ to the next BMIC 108 in the daisy chain one bit time later than the transmission of response $130_2$ by BMIC $108_2$ to BMIC $108_3$ which is two bit times later than the transmission of response $130_1$ by BMIC $108_1$ to BMIC $108_2$.

When the first bit of the module voltage measurement of BMIC $108_1$, e.g., left most bit of data packet $124_1$, is received by BMIC $108_2$, BMIC $108_2$ adds the first bit of its own module voltage measurement 132 to the first bit of data packet $124_1$ of BMIC $108_1$ and then transmits the summed first bit as the first bit of data packet $124_2$ of response $130_2$ to BMIC $108_3$. When the first bit of the data packet $124_2$ of response $130_2$ is received by BMIC $108_3$, BMIC $108_3$ adds the first bit of its own module voltage measurement 134 to the first bit of the data packet $124_2$ of BMIC $108_2$ and then transmits the summed first bit as the first bit in the data packet $124_3$ of response $130_3$ to the next BMIC 108 in the daisy chain.

In addition, any carryover from the summation of a bit is tracked and applied to the summation of the next bit of the data packet 124 that is received from the BMIC 108 higher in the chain and the next bit of the module voltage measurement for the current BMIC 108. For example, carryover is depicted in FIG. 9 as a curved arrow pointing to the next bit of module voltage measurement 132 and module voltage measurement 134. As an example, the third bit of data packet $124_1$ is summed with the third bit of module voltage measurement 132. Since both have a value of 1, the third bit of data packet $124_2$ is set to 0 and a value of 1 is carried over. When the fourth bit of data packet $124_1$ having a value of 1 is received, it is summed with the fourth bit of module voltage measurement 132, a value of 0, and the carryover value of 1, resulting in a value of 0 for the fourth bit of data packet $124_2$ with another carryover of 1 to the fifth bits, as shown in FIG. 9.

This summation process with carryover continues down the daisy chain as the bits of the data packets 124 of each response 130 are passed along until the final response $130_n$ reaches MCU 106. The final response $130_n$ includes a data packet 124 comprising the total pack voltage measurement, e.g., the summation of all of the module voltage measurements as performed by each successive BMIC 108 in the daisy chain on a bit-by-bit basis. MCU 106 may then utilize the total pack voltage measurement found in data packet 124 of response $130_n$ to calculate the instantaneous battery pack power for optimizing the performance of the xEV or other application. In this manner, an entire, accurate, total pack voltage measurement can be taken with the effective bandwidth and latency of just a single command and a single response, e.g., since the final response $130_n$ is provided to MCU 106 at the same latency that a response from BMIC $108_1$ would take to simply pass down the daisy chain by each BMIC 108 as is.

Figure 10:
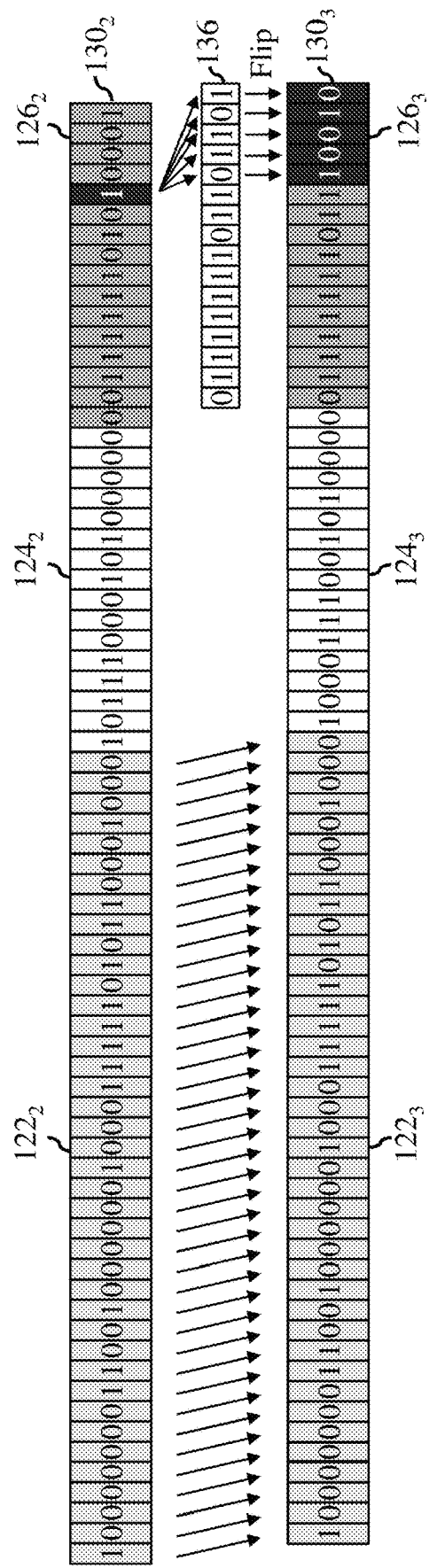
FIG. 10 is a diagram illustrating an example modification to a redundancy check value of a response according to the communication process of FIG. 6 according to an embodiment.

With reference to FIG. 10, in some embodiments, each BMIC 108 also calculates a CRC 126 that accompanies each data packet 124. For example, BMIC $108_3$ calculates CRC $126_3$ based on the values of the bits of data packet $124_3$, e.g., the summation of the bits of data packet $124_2$ and module voltage measurement 134 (FIG. 8). However, if CRC $126_2$ received in response $130_2$ is incorrect, which may indicate corruption, simply calculating a new CRC $126_3$ for response $130_3$ may result in a missed error since each response 130 is not passed along to MCU 106 as is. In an illustrative embodiment, such errors may be overcome by propagating the error through the CRC calculation for each response.

For example, each BMIC 108 is configured to check the CRC 126 of the incoming data packet 124 for errors, e.g., by recalculating the CRC based on the incoming data packet 124. If the calculated CRC does not match the CRC 126 of the incoming data packet 124, there is an error. In an embodiment, each BMIC 108 is configured to propagate the error condition by flipping one or more remaining CRC bits in its own CRC 126 before they are transmitted. Since the outgoing response 130 is delayed by one bit time from the incoming response 130, at least the final outgoing CRC bit will be flipped if there is an error which will cause an error to be calculated by the next BMIC 108 in the chain.

In other embodiments, any other number of the remaining CRC bits may be flipped based on an error in the prior CRC including one CRC bit, two CRC bits or any other number of CRC bits. In some embodiments, a predetermined CRC bit may be set or flipped in response to the detection of an error in the CRC calculation. For example, in some embodiments, the last bit or any other remaining bit in CRC 126 may be flipped regardless of where the error occurred. In some embodiments, response 130 may comprise an additional CRC error bit that may be set to a predetermined value, e.g., 0 or 1, in response to a detection of an error in the CRC calculation by the BMIC 108 where the CRC error bit is separate from the CRC calculation and the setting is propagated through the daisy chain. Any other manner of propagating a CRC error through the daisy chain may alternatively be utilized in other embodiments.

As shown in FIG. 10, response 130₂ is received by BMIC 108₃ from BMIC 108₂. In this example, bit 4 of CRC 126₂ is incorrect. When BMIC 108₃ calculates the CRC for data packet 124₂, it determines that bit 4 is incorrect. As BMIC 108₃ calculates and transmits CRC 136 for data packet 124₃, BMIC 108₃ flips CRC bits <4:0>, e.g., from 0 to 1 and vice versa, based on the error found in bit 4 of CRC 126₂, thereby assuring that the remaining BMICs 108 in the daisy chain will also detect an error and that the final response 130ₙ provided to MCU 106 will include a CRC 126 with an error. In this manner, MCU 106 will be aware that FPMC 128 and the corresponding response 130ₙ received by MCU 106 have failed to provide a valid total pack voltage measurement to MCU 106.

While the embodiments of FIGS. 6-10 are described for use with BMS 100 to measurement battery pack voltages, the process and functionality disclosed with reference to FIGS. 6-10 may alternatively be utilized in any system comprising a daisy chain architecture to efficiently return a summed measurement of any other property of any other set of devices. For example, a total of a fluid concentration, a total of temperatures measured over an area or volume, a total fluid volume stored in a number of vessels or other similar measurements may be measured by a daisy chain architecture of measurement devices spread around an area or volume. As another example, a total count of some object or action over multiple measurement devices may also be measured using the disclosed daisy chain architecture and measurement process.

While described as having particular components herein, BMS 100 may comprise alternative or additional components or configurations of circuitry that are commonly found in a BMS.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising a first battery management circuit, the first battery management circuit being configured to:
   measure a voltage of a first battery cell of a battery pack;
   generate a first voltage measurement based at least in part on the measured voltage of the first battery cell;
   receive a bit of a first response from a second battery management circuit, the bit of the first response being generated by the second battery management circuit based at least in part on a measured voltage of a second battery cell of the battery pack;
   sum the bit of the first response with a corresponding bit of the first voltage measurement; and
   provide the summed bit to a third battery management circuit as part of a second response,
   wherein:
   the first response comprises a first plurality of bits;
   the second response comprise a second plurality of bits; and
   the first battery management circuit is configured to:
   receive the first response from the second battery management circuit bit-by-bit;
   provide the second response to the third battery management circuit bit-by-bit; and
   delay providing the bits of the second response to the third battery management circuit by one bit time relative to the receipt of corresponding bits of the first response.

2. The apparatus of claim 1, wherein:
   the first response comprises a plurality of data packet bits, the plurality of data packet bits comprising the received bit of the first response, the plurality of data packet bits being generated least significant bit first by the second battery management circuit based at least in part on the measured voltage of the second battery cell of the battery pack; and
   the first battery management circuit is configured to:
   receive the plurality of data packet bits bit-by-bit least significant bit first;
   sum each bit of the plurality of data packet bits with corresponding bit of the first voltage measurement bit-by-bit least significant bit first; and
   provide the summed bits to a third battery management circuit as part of the second response bit-by-bit least significant bit first.

3. The apparatus of claim 2, wherein summing each bit of the plurality of data packet bits with corresponding bit of the first voltage measurement comprises summing a given bit of the plurality of data packet bits with a corresponding bit of the first voltage measurement and a carryover value of the sum of a prior bit of the plurality of data packet bits with the corresponding bit of the first voltage measurement.

4. The apparatus of claim 1, wherein the first battery management circuit, the second battery management circuit and the third battery management circuit are connected in a daisy chain configuration, the first battery management circuit being connected between the second battery management circuit and the third battery management circuit.

5. The apparatus of claim 4, wherein the third battery management circuit is connected between the first battery management circuit and a processing device, the third battery management circuit being configured to provide a third response to the processing device, the third response comprising an indication of a total battery pack voltage of the battery pack.

6. The apparatus of claim 1, wherein the first battery management circuit is configured to:
   measure voltages of a plurality of battery cells of the battery pack including the first battery cell; and
   generate the first voltage measurement based at least in part on the measured voltages of the plurality of battery cells.

7. The apparatus of claim 1, wherein the first battery management circuit is configured to:
   calculate a first redundancy check value for the first response based at least in part on the received bit;
   compare the first redundancy check value to a corresponding second redundancy check value received as part of the first response;
   determine that a given bit of the first redundancy check value does not match a corresponding bit of the second redundancy check value;
   calculate a third redundancy check value based at least in part on the summed bit;
   flip a value of a bit of the third redundancy check value based at least in part on the determination that the given bit of the first redundancy check value does not match the corresponding bit of the second redundancy check value; and
   provide the third redundancy check value with the flipped bit to the third battery management circuit as part of the second response.

8. The apparatus of claim 7, wherein flipping the value of the bit of the third redundancy check value based at least in part on the determination that the given bit of the first redundancy check value does not match the corresponding bit of the second redundancy check value comprises flipping all remaining bits of the third redundancy check value; and
   providing the third redundancy check value with the flipped bit to the third battery management circuit as part of the second response comprises providing the third redundancy check value with all remaining bits flipped to the third battery management circuit as part of the second response.

9. A system comprising:
   a plurality of circuits connected in a daisy chain, each given circuit of the plurality of circuits being configured to:
   measure a property of a device of a plurality of devices that corresponds to the given circuit;
   generate a measurement value corresponding to the given circuit based at least in part on the measurement of the property of the device corresponding to the given circuit;
   receive a bit from a preceding circuit in the daisy chain, the bit from the preceding circuit being generated by the preceding circuit based at least in part on a measurement value generated by the preceding circuit;
   sum the received bit with a corresponding bit of the measurement value corresponding to the given circuit; and
   provide the summed bit to a subsequent circuit in the daisy chain,
   wherein each given circuit of the plurality of circuits is configured to:
   receive data from the preceding circuit in the daisy chain bit-by-bit and to provide data to the subsequent circuit in the daisy chain bit-by-bit, the received data comprising the received bit and the provided data comprising the summed bit; and
   delay providing the bits to the subsequent circuit by one bit time relative to the receipt of corresponding bits from the preceding circuit.

10. The system of claim 9, wherein each given circuit of the plurality of circuits is configured to:
    receive the data from the preceding circuit bit-by-bit least significant bit first;
    sum each bit of the received data with a corresponding bit of the measurement value generated by the given circuit bit-by-bit least significant bit first; and
    provide the summed bits to the subsequent circuit bit-by-bit least significant bit first.

11. The system of claim 10, wherein summing each bit of the received data with the corresponding bit of the measurement value generated by the given circuit comprises summing a given bit of the received data with a corresponding bit of the measurement value generated by the given circuit and a carryover value of the sum of a prior bit of the received data with the bit of the measurement value generated by the given circuit that corresponds to the prior bit.

12. The system of claim 9, further comprising an end circuit connected to a processing device and connected to the circuit of the plurality of circuits at an end of the daisy chain, the end circuit being configured to:
    measure the property of a device of the plurality of devices that corresponds to the end circuit;
    generate an end circuit measurement value based at least in part on the measurement of the property of the device corresponding to the end circuit;
    receive a bit from the circuit at the end of the daisy chain, the bit from the circuit at the end of the daisy chain being generated by the circuit at the end of the daisy chain based at least in part on the measurement value generated by the circuit at the end of the daisy chain;
    sum the bit received from the circuit at the end of the daisy chain with a corresponding bit of the end circuit measurement value; and
    provide the summed bit to the processing device, the summed bit corresponding to a total measurement value of the property for all of the plurality of devices.

13. The system of claim 12, wherein the plurality of devices comprise battery cells of a battery pack and the total measurement value comprises a total battery pack voltage of the battery pack.

14. The system of claim 13, wherein each given circuit of the plurality of circuits is configured to:
    measure voltages of corresponding battery cells of the battery pack; and
    generate the measurement value based at least in part on the measured voltages of the battery cells.

15. The system of claim 9, wherein each given circuit of the plurality of circuits is configured to:
    calculate a first redundancy check value based at least in part on the bit received from the preceding circuit;
    compare the first redundancy check value to a corresponding second redundancy check value received from the preceding circuit;

determine that a given bit of the first redundancy check value does not match a corresponding bit of the second redundancy check value;
calculate a third redundancy check value based at least in part on the summed bit;
flip a value of a bit of the third redundancy check value based at least in part on the determination that the given bit of the first redundancy check value does not match the corresponding bit of the second redundancy check value; and
provide the third redundancy check value with the flipped bit to the subsequent circuit.

16. The system of claim 15, wherein flipping the value of the bit of the third redundancy check value based at least in part on the determination that the given bit of the first redundancy check value does not match the corresponding bit of the second redundancy check value comprises flipping all remaining bits of the third redundancy check value; and
provide the third redundancy check value with the flipped bit to the subsequent circuit comprises providing the third redundancy check value with all remaining bits flipped to the subsequent circuit.

17. A method performed by a circuit comprising hardware, the method comprising:
measuring a voltage of a first battery cell of a battery pack;
generating a first voltage measurement based at least in part on the measured voltage of the first battery cell;
receiving a bit of a first response from a second battery management circuit, the bit of the first response being generated by the second battery management circuit based at least in part on a measured voltage of a second battery cell of the battery pack;
summing the bit of the first response with a corresponding bit of the first voltage measurement; and
providing the summed bit to a third battery management circuit as part of a second response,
wherein:
the first response comprises a first plurality of bits;
the second response comprise a second plurality of bits; and
the method comprises:
receiving the first response from the second battery management circuit bit-by-bit;
providing the second response to the third battery management circuit bit-by-bit; and
delaying providing the bits of the second response to the third battery management circuit by one bit time relative to the receipt of corresponding bits of the first response.

* * * * *